United States Patent [19]
Crippen

[11] Patent Number: 6,037,636
[45] Date of Patent: Mar. 14, 2000

[54] ELECTROSTATIC DISCHARGE PROTECTION CIRCUIT AND METHOD

[75] Inventor: Richard E. Crippen, Mountain View, Calif.

[73] Assignee: National Semiconductor Corporation, Santa Clara, Calif.

[21] Appl. No.: 09/081,333

[22] Filed: May 19, 1998

[51] Int. Cl.[7] .................................................. H01L 29/72
[52] U.S. Cl. ......................... 257/355; 257/328; 257/356; 257/357; 257/360; 361/56
[58] Field of Search .................... 257/355, 328, 257/356, 357, 360; 361/56

[56] References Cited

U.S. PATENT DOCUMENTS

| | | | |
|---|---|---|---|
| 5,430,595 | 7/1995 | Wagner et al. | 361/56 |
| 5,440,163 | 8/1995 | Ohhashi | 257/355 |
| 5,452,171 | 9/1995 | Metz et al. | 361/56 |
| 5,455,436 | 10/1995 | Cheng | 257/356 |
| 5,465,189 | 11/1995 | Polgreen et al. | 361/58 |
| 5,477,414 | 12/1995 | Li et al. | 361/56 |
| 5,517,049 | 5/1996 | Huang | 257/357 |
| 5,541,801 | 7/1996 | Lee et al. | 361/56 |
| 5,545,909 | 8/1996 | Williams et al. | 257/355 |
| 5,547,887 | 8/1996 | Brown et al. | 437/51 |
| 5,593,911 | 1/1997 | Lee et al. | 437/51 |
| 5,615,073 | 3/1997 | Fried et al. | 361/56 |
| 5,616,943 | 4/1997 | Nguyen et al. | 257/355 |
| 5,618,740 | 4/1997 | Huang | 438/224 |
| 5,623,156 | 4/1997 | Watt | 257/355 |
| 5,631,793 | 5/1997 | Ker et al. | 361/56 |
| 5,654,574 | 8/1997 | Williams et al. | 257/355 |

*Primary Examiner*—Edward Wojciechowicz
*Attorney, Agent, or Firm*—Limbach & Limbach L.L.P.

[57] ABSTRACT

An electrostatic discharge (ESD) protection circuit for the output pads of an integrated circuit. The protection circuit includes an NMOS output transistor, an NMOS protection transistor and an NMOS bias transistor. The output and protection transistors are preferably embodied in a common merged transistor structure and have common drains connected to the output pad and common sources connected to the integrated circuit common. The bias transistor controls the gate-source bias of the protection circuit and operates to cause the output and the protection transistors to conduct current in proportion to the relative size of the transistors thereby maximizing the protection against damage by ESD.

19 Claims, 2 Drawing Sheets

ELECTROSTATIC DISCHARGE PROTECTION CIRCUIT AND METHOD

BACKGROUND OF THE INVENTION

1. Field of the Invention

The present invention relates generally to integrated circuit protection devices and in particular to circuits for preventing damage to MOS integrated circuits by electrostatic discharge (ESD).

2. Description of Related Art

Integrated circuits utilizing MOS (metal oxide semiconductor) transistors are vulnerable to electrostatic discharge (ESD) induced failures, particularly transistors which are part of the integrated circuit interface circuitry connected to the external pins/pads of the circuit. Various standards have been developed to measure the tolerance of an integrated circuit to ESD. One such standard is the HBM (Human Body Model) military specification (MIL-STD-883D, Method 3015.7) intended to simulate the effects of ESD produced by a human which comes into contact with the pins of an integrated circuit. The so-called 2 KV HBM stress test generally calls for a capacitor of 100 pF to be charged to 2 KV. The capacitor is connected in series with a 1.5 kΩ resistor to simulate the impedance of a human body and the series circuit is connected across any two pins of the integrated circuit. The remaining pins of the integrated circuit under test are left unconnected. The resultant high voltage across the two pins will invariably result in a current flow through the integrated circuit on the order of 1.3 amperes, most of which flows in a period of less than 150 nanoseconds. In order to comply with the standard, the integrated circuit must be capable of enduring the test without permanent failure.

Various attempts have been made to provide circuitry associated with the integrated circuit interface pads to prevent damage due to ESD. One technique for providing a degree of protection is to connect an NMOS transistor having a grounded gate between the interface pads and the circuit common. Referring to the drawings, FIG. 1 shows a metal pad 10 which functions as one of the outputs of an integrated circuit. NMOS transistor 12 represents a portion of an output circuit of the integrated circuit. The drain of transistor 12 is connected to receive an input In which is to be buffered by the output circuit. In some application, a PMOS transistor (not depicted) may be connected between the output pad 10 and the positive supply voltage $V_{CC}$ to act as a pull-up. In other applications, the drain of transistor 12 is left unconnected, with the pull-up function being performed by circuitry external to the integrated circuit. This is sometimes referred to as an open-drain output.

FIG. 1 further includes a grounded gate NMOS transistor, generally designated by the numeral 14, connected between the pad 10 and the circuit common (or most negative voltage applied to the integrated circuit) $V_{SS}$. Protection transistor 14, which is depicted in a simplified cross-sectional view, is formed in a P-type substrate with an overlying P type epitaxial (epi) region. An N+ diffusion 20 in epi 18 functions as the drain, with N region 20A forming a lightly doped section of the drain. A second N+ diffusion 22 functions as the source, with N region 22A forming a lightly doped section of the source. The area 18A intermediate the drain and source is the channel region of the transistor. A polysilicon gate 30 is disposed over the channel region 18A. In addition, a P+ region 32 is included for providing a contact to the transistor body (epi 18). As can be seen from FIG. 1, the drain 20 of protection transistor 14 is connected to the output pad 10, with the gate, source and body being connected to $V_{SS}$.

Under normal operating conditions where power is applied to the power rails of the integrated circuit, the voltage at pad 10 is permitted to vary between the positive supply voltage $V_{CC}$ and $V_{SS}$. NMOS protection transistor 14 will remain off due to the grounded gate 30. Output transistor 12 is thus free to drive the output pad 10 in response to changes in signal In.

When the integrated circuit is to be subjected to an ESD stress test, all connections to the integrated circuit, including the power connections, are removed. The simulated ESD voltage, such as is generated in the above-described HBM test, is applied to pad 10 which is positive with respect to $V_{SS}$. This will cause the drain-source voltage of protection transistor 14 to rapidly increase to a value significantly larger than the normal positive supply voltage $V_{CC}$.

FIG. 2 is a graph 34 illustrating the relationship between the drain-source voltage $V_{DS}$ and the drain-source current $I_{DS}$ of transistor 14. The large drain voltage operates to increase the reverse bias on the PN junction formed between N-type drain 20 and the P-type epi 18. At voltage $V_{t1}$, the reversed biased junction undergoes avalanche breakdown which results in a drain-source current flow of $I_{t1}$. The additional electron-hole pairs created by the breakdown cause the potential of the epi 18 to rise until the PN junction between the channel region 18A and the source region 22 becomes forward biased. This causes a parasitic lateral NPN bipolar transistor to conduct, with the drain 20 functioning as the collector, the channel region 18A of the epi acting as the base and the source region functioning as the emitter. The base current of the parasitic transistor is supplied by holes generated by impact ionization in the channel region 18A near drain 20A.

The conductive action of the parasitic NPN transistor causes voltage $V_{DS}$ to drop as indicated by graph section 34A of the FIG. 2 graph. This action is sometimes referred to as snap-back where the circuit exhibits negative resistance. If current $I_{DS}$ is permitted to increase, a second breakdown will occur at a drain-source voltage of $V_{t2}$ which causes a drain-source current to increase to $I_{t2}$. The second breakdown is a result of thermal runaway which usually operates to permanently damage the transistor. However, if the transistor remains in a region less than $I_{t2}$, as indicated by graph section 34B, no permanent damage will be sustained.

In order to increase the level of current $I_{t2}$ at which point thermal runaway occurs, transistor 14 is typically configured to have a large channel width W compared to the width of the channel of transistor 12. This is achieved by implementing transistor 14 in a large number of segments (fingers), with each segment being a single MOS transistor. The respective drain, source and gates of each of the N segments of W width are connected together to form a single transistor having an effective channel width of N*W. When the transistor 14 is operating in the avalanche mode (graph section 34B), the current is ideally distributed equally among the various transistor segments thereby reducing the likelihood of localized overheating that results in thermal runaway and the attendant secondary breakdown.

One disadvantage of the above-described approach is that under certain conditions, the ESD current will be split between the output transistor 12 and the protection transistor 14. Transistor 12 will usually be a relatively small device compared to transistor 14 and will have a typical maximum current capability of less than 10 milliamperes, with the maximum peak current being significantly higher. The ESD current will be in excess of 1.3 Amperes in accordance with the 2 KV Human Body Model specification. Thus, if the small transistor 12 is allowed to carry a too large a portion of the total ESD current, the transistor could be permanently damaged.

One prior art approach to address the problem is to insert a fixed resistance (not depicted) between the gate 30 and source 22 of transistor 14 as described in U.S. Pat. No. 5,615,073. When positive going ESD event occurs on pad 10, capacitive coupling between the drain and gate causes the gate voltage to increase. Since there is a substantially linear relationship between the drain current of a transistor and the impact ionization current which affects the operation of the parasitic NPN transistor, the increased gate voltage causes the avalanche breakdown voltage $V_{t1}$ (FIG. 2) to decrease below the magnitude of the secondary breakdown voltage $V_{t2}$. Protection from ESD is increased by lowering $V_{t1}$ to a value below $V_{t2}$ so that thermal runaway occurs at a higher magnitude of ESD voltage. A clamp transistor (not depicted) is connected in parallel with the resistor of the prior art protection circuit to limit the gate voltage to a maximum value.

Although the above-described prior art protection circuitry provides a significant improvement over no protection at all, it has been found that a small number of integrated circuits using the protection circuitry will not pass the 2 KV HBM stress test. In those cases, current flow will be divided between the large transistor 14 and the small transistor 12 such that the small transistor will be forced to carry an excessive amount of current for any given value of resistance connected between the gate and source of transistor 14.

The present invention provides a further improvement in ESD protection over the above-described approaches. Reliable protection is provided without adding significantly to the complexity of the integrated circuit. These and other advantages of the present invention will become apparent to those skilled in the art upon a reading of the following Detailed Description of the Invention together with the drawings.

SUMMARY OF THE INVENTION

An electrostatic discharge (ESD) protection circuit formed in an integrated circuit having interface pads and related method are disclosed. The protection circuit includes an NMOS protection transistor having a drain connected to the pad to be protected and a source connected to a first power rail, such as the circuit common. The protection circuit further includes an NMOS output transistor also having a drain connected to the pad and a source connected to the first power rail and a gate connected to the source of an internal integrated circuit signal.

In a typical implementation, in normal operation, the inverse of the internal integrated circuit signal, which is produced by an internal drive transistor, appears at the pad. Further, it is preferred that the protection transistor and the output transistor be implemented in a common merged transistor structure. Still further, it is preferred that the protection transistor and the output transistor have a total effective channel width of at least 300 microns, with a larger total width being preferred.

The protection circuit further includes an NMOS bias transistor having a drain connected to a gate of the protection transistor and a source connected to the first power rail. The gate of the bias transistor is connected to a voltage source which is positive with respect to the first power rail when the integrated circuit is in a normal mode of operation. The conductive bias transistor thus causes the protection transistor to be non-conductive during the normal operating mode. However, when an actual or simulated ESD event occurs, the bias transistor operates to bias the protection transistor in the same manner as the drive transistor biases the output transistor. Thus, the protection transistor and the output transistor conduct the large current caused by the ESD event in proportion to the ratio of the effective channel widths. Thus, the smaller output transistor is less likely to be damaged by the large current absorbed by the integrated circuit.

DETAILED DESCRIPTION OF THE INVENTION

Figure 1:
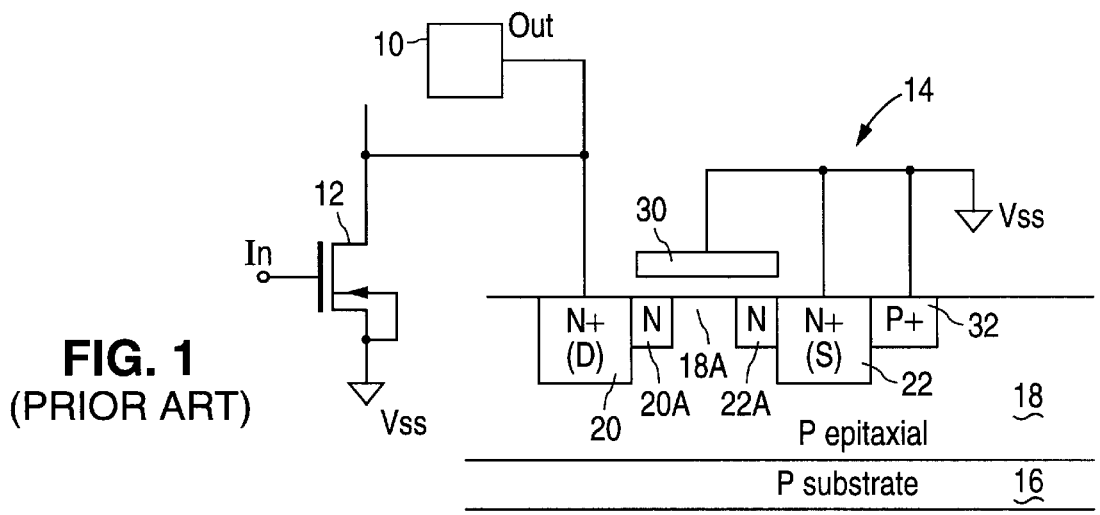
FIG. 1 is a diagram of a portion of a prior art integrated circuit output stage and associated electrostatic discharge (ESD) protection circuitry.
Figure 2:
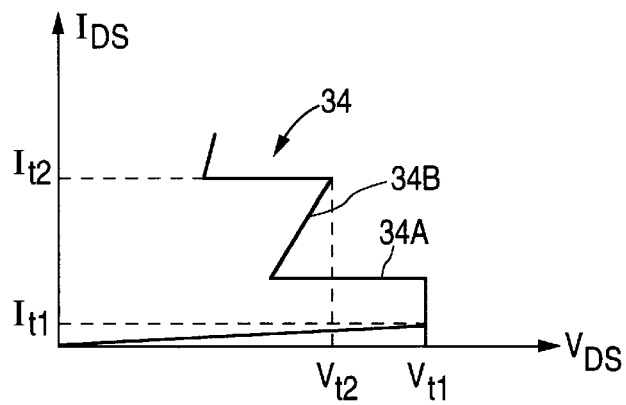
FIG. 2 is a graph showing the current/voltage relationship of the FIG. 1 protection circuitry transistor.
Figure 3:
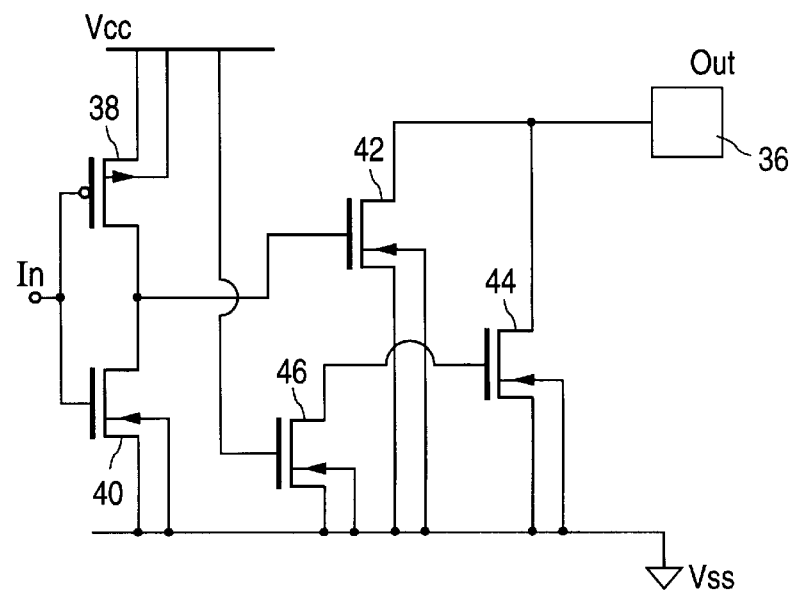
FIG. 3 is a diagram of a ESD protection circuitry in accordance with the present invention.

Referring again to the drawings, FIG. 3 depicts ESD protection circuitry for an integrated circuit output pad 36 in accordance with the present invention. The integrated circuit includes an exemplary CMOS inverter stage comprising PMOS transistor 38 and NMOS transistor 40. The output of the inverter stage is connected to the gate of an NMOS output transistor 42 having a drain connected to the output pad 36. The output circuit is of the open drain configuration so that pull up of the pad 36 is carried out by circuitry external to the integrated circuit.

An NMOS protection transistor 44 has a drain connected to the output pad 36 and the source and body connected to the circuit common $V_{SS}$. The gate of the protection transistor 44 is connected to the drain of a bias NMOS transistor 46, with the source and body being connected to $V_{SS}$. The gate of transistor 46 is connected to the positive supply $V_{CC}$. In a typical implementation using 0.6 micron technology, output transistor 42 has a 0.6 micron channel length and a width of 67 microns. Protection transistor 44 has a channel length of 0.6 microns and an effective width of 469 microns. Thus, the total effective channel width of the two transistors is 536 microns.

Figure 4:
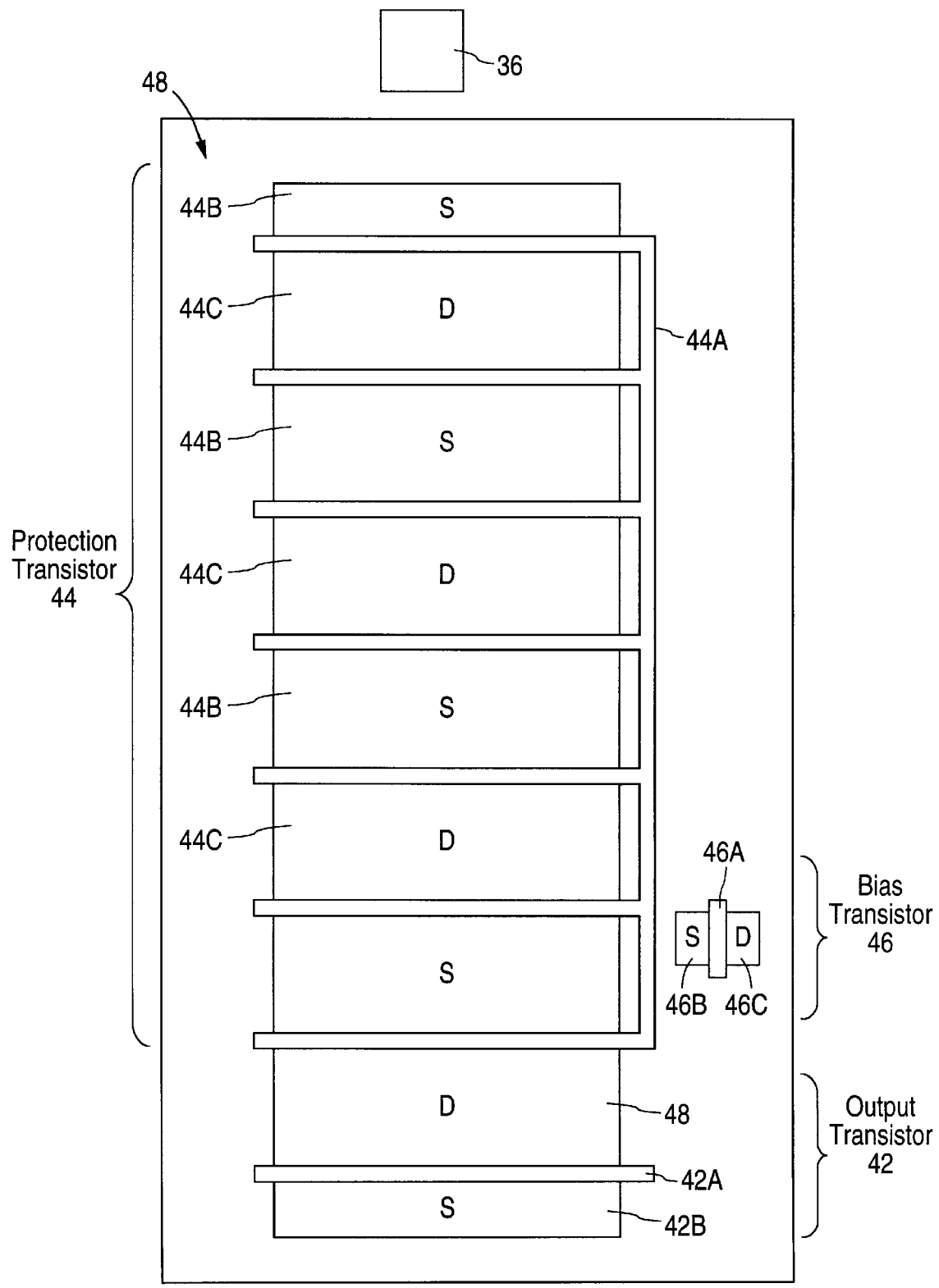
FIG. 4 is a schematic diagram of the layout of the FIG. 3 protection circuitry.

Protection transistor 44 and output transistor 42 are preferably implemented as part of a common merged transistor structure. FIG. 4 is a schematic layout (not to scale) showing the manner in which transistors 42 and 44 are implemented in the merged structure. The transistor structure includes an array of alternating N-type source regions 44B/42B and N-type drain regions 44C/48 formed in a common P-type body or epi region (not designated). Thus, there are a total of eight segments or fingers which define eight separate channels formed in the common body region. In the present exemplary embodiment, seven of the segments are devoted to protection transistor 44 and one is used for output transistor 42. Each channel has an associated overlying polysilicon gate, with common gate structure 44A being disposed over the seven transistor 44 channels and with a separate gate structure 42A extending over the single channel of transistor 42.

Most of the interconnections are not shown in FIG. 4, including the electrical interconnections of all of the source regions 44B and 42B and all of the interconnections of drain regions 44C and 48. Each segment has a channel width of 67 microns to arrive at the effective channel widths noted above for each transistor 42 and 44. The spacing between each of the drain contacts (not depicted) relative to the polysilicon gates 42A and 44A is at least 5 microns so that the metal contact will not be overheated by the high temperature which is created at the junction between the channel and the drain of the transistor. The bias transistor 46 is located adjacent to the protection transistor 44 and is not part of the common structure.

As can be seen from the FIG. 4 layout diagram, output transistor 42 is preferably positioned at a location such that the large geometry protection transistor 44 is positioned intermediate the output pad 36 and output transistor 42. The length of the metal connection between the transistor 42 drain and the pad 36 is thus maximized so as to create a series resistance in the connection which is greater than the resistance in the connection between protection transistor 44 and the pad. The difference in resistance will increase the tendency of the pad current to flow through the protection transistor 44 rather than the smaller output transistor 42.

In normal operation, the input In will vary between high and low voltage levels thereby causing the gate of output transistor 42 to change levels thereby driving the output transistor 42. Further, bias transistor 46 will be conductive due to the gate connection to $V_{CC}$ and will function to hold the gate-source voltage of the protection transistor 44 close enough to ground level ($V_{SS}$) so that transistor 44 will be off.

When an ESD stress test is to be performed on the output pad 36 and the pad connected to common $V_{SS}$, all other connections to the integrated circuit are removed, including supply $V_{CC}$. Under these unpowered conditions, transistor 40 provides an effective impedance between the gate of output transistor 42 and ground which is approximated by the impedance created by bias transistor 46 between the gate of protection transistor 44 and ground. Thus, when an ESD voltage, or simulated ESD voltage, is applied to pad 36, both transistors 42 and 44 will experience avalanche breakdown at essentially the same voltage Vt1 and the avalanche or snap back current will be divided between the two transistors in proportion to the ratio of effective channel widths. There will be little tendency for smaller transistor 42 to conduct any more than 1/7 of the current regardless of any process variations from lot to lot or from wafer to wafer.

Since the large discharge current is divided proportionally between the eight sections of the transistor 42/44 structure, the onset of thermal runaway is extended to very high currents. A transistor structure as depicted in FIG. 4 and described above was subjected to ESD stress testing at a voltage which exceeded a 5 KV HBM ESD without failure. This represents a significant improvement over prior art protection structures where a small but significant number of circuits manufactured are unable to pass the lower 2 KV HBM test.

Note that in a typical applications, a standard ESD protection circuit is associated with pads of a certain type i.e., open drain, input only, input and output, etc. In that event it is not possible to always make the geometry of the bias transistor 46 of the protection circuitry the same as the transistor 40 driving the output transistor since transistor 40 is not part of the standard protection circuit and can vary depending upon the requirements of a particular integrated circuit function. In that event, the bias transistor 46 geometry is selected to match the average geometry expected to be used for drive transistor 40. It should also be noted that additional well known ESD protection circuits may be required for a particular integrated circuit in order to provide more complete protection.

Thus, a novel protection circuit and method have been disclosed. Although one embodiment has been described in some detail, it is to be understood that certain changes can be made by those skilled in the art without departing from the spirit and scope of the invention as defined by the appended claims. By way of example, the total output transistor and protection transistor effective channel width could be reduced to only 300 microns and still provide a significant degree of protection while occupying a reduced die area.

I claim:

1. An ESD protection circuit formed in an integrated circuit having interface pads, said protection circuit comprising:

an NMOS protection transistor having a drain connected to one of the interface pads and a source connected to a first power rail of the integrated circuit;

an NMOS output transistor having a drain connected to the one interface pad, and a source connected to the first power rail and a gate connected to a source of an internal integrated circuit signal; and an NMOS bias transistor having a drain connected to a gate of the protection transistor and a source connected to the first power rail and a gate connected to a voltage source which is positive with respect to the first power rail when the integrated circuit is in a normal operating mode.

2. The ESD protection circuit of claim 1 wherein the protection transistor and the output transistor are formed in a common merged transistor structure, with the transistor structure including a multiplicity of alternating source and drain regions disposed in a common body region and which define channel regions in the body region intermediate the source and drain regions and wherein a first gate structure extends over a first portion of the channel regions to form a gate of the protection transistor and a second gate structure extends over a second portion of the channel regions to form the gate of the output transistor.

3. The ESD protection circuit of claim 2 wherein the protection transistor and the output transistor have a total effective channel width of at least 300 microns.

4. The ESD protection circuit of claim 3 wherein the internal integrated circuit signal source includes an NMOS drive transistor having a drain connected the signal source and a source connected to the first power rail.

5. The ESD protection circuit of claim 4 wherein the first power rail comprises a circuit common of the integrated circuit.

6. The ESD protection circuit of claim 5 wherein the gate of the bias transistor is connected to a second power rail which comprises a positive supply voltage source relative to the first power rail.

7. An over voltage protection circuit formed in an integrated circuit having interface pads, said protection circuit comprising:

a merged transistor structure which includes an array of alternating N-type drain and source regions formed in a common P-type body region and defining channel regions in the body region intermediate the drain and source regions and a first gate structure disposed over a first portion of the channel regions and a second gate structure disposed over a second portion of the channel regions, with the source regions being connected to a circuit common of the integrated circuit and the drain regions connected to one of the interface pads;

a source of an internal integrated circuit signal connected to the second gate structure; and a bias circuit which includes a first N-type region formed in the body region and a second N-type region formed in the body region so as to define a bias channel region in the body region intermediate the first and second N-type regions, with a gate structure disposed over the bias channel region and connected to a portion of the integrated circuit other than the first and second N-type regions and with the first N-type region connected to the first gate structure.

8. The over voltage protection circuit of claim 7 wherein the first and second portions of the channel regions of the merged transistor have a same channel length between the drain and source regions and wherein the total effective channel width is at least 300 microns.

9. The over voltage protection circuit of claim 8 wherein the second N-type region of the bias circuit is connected to the circuit common.

10. The over voltage protection circuit of claim 9 wherein the gate structure of the bias circuit is connected to a source of voltage which is positive with respect to the circuit common when the integrated circuit is in a normal operating mode.

11. An over voltage protection circuit formed in an integrated circuit having interface pads, said protection circuit comprising:

a merged transistor structure which includes an array of alternating N-type drain and source regions formed in a common P-type body region and defining channel regions in the body region intermediate the drain and source regions and a first gate structure disposed over a first portion of the channel regions and a second gate structure disposed over a second portion of the channel regions, with the source regions being connected to a circuit common of the integrated circuit and the drain regions connected to one of the interface pads;

a source of an internal integrated circuit signal connected to the second gate structure, said signal source having an output impedance which varies when an over voltage is applied to the one interface pad which is greater in magnitude than a supply voltage used when the integrated circuit is in a normal operating mode; and a bias circuit connected to the first gate structure having an output impedance which approximates the signal source output impedance, including the variations when the over voltage is applied.

12. The over voltage protection circuit of claim 11 wherein the bias circuit includes an N-type transistor having a source connected to the circuit common and a drain connected to the first gate structure.

13. The over voltage protection circuit of claim 12 wherein the N-type transistor of the bias circuit includes a gate connected to a voltage source which is positive with respect to the circuit common when the integrated circuit is in the normal operating mode.

14. An over voltage protection circuit formed in an integrated circuit having interface pads, said protection circuit comprising:

a merged transistor structure which includes an array of alternating N-type drain and source regions formed in a common P-type body region and defining channel regions in the body region intermediate the drain and source regions and a first gate structure disposed over a first portion of the channel regions and a second gate structure disposed over a second portion of the channel regions, with the source regions being connected to a circuit common of the integrated circuit and the drain regions connected to one of the interface pads;

a source of an internal integrated circuit signal connected to the second gate structure; and an NMOS bias transistor which includes a source connected to the circuit common, a drain connected to the first gate structure and a gate connected to a source of a positive voltage with respect to the circuit common when the circuit is in a normal operating mode.

15. The over voltage protection circuit of claim 14 wherein the first and second portions of the channel regions have a total effective channel width of at least 300 microns.

16. A method of reducing damage to an integrated circuit due to simulated ESD, with the integrated circuit including an interface pad, an NMOS output transistor having a drain connected to the interface pad and a gate connected to an internal signal source and a protection NMOS transistor having a drain connected to the interface pad, said method comprising:

controlling a gate-source potential of the protection transistor so that the protection transistor is in a non-conducting state when the integrated circuit is in a normal operating mode: and controlling the gate-source potential of the protection transistor so that the protection transistor and the output transistor respectively conduct a current which is proportional to a ratio of effective channel widths of the protection transistor and the output transistor when the simulated ESD is applied to the integrated circuit.

17. The method of claim 16 wherein the controlling the gate-source voltage include the steps of connecting a drain of an N-type bias transistor to a gate of the protection transistor and a source of the bias transistor to a source of the protection transistor and controlling the gate-source voltage of the bias transistor so that the bias transistor is conducting when the integrated circuit is in the normal operating mode.

18. The method of claim 17 further include forming the protection transistor and the bias transistor in a common merged transistor structure.

19. A method of reducing damage to an integrated circuit due to simulated ESD, with the integrated circuit including an interface pad, an NMOS output transistor having a drain connected to the interface pad and a gate connected to an internal signal source and a protection NMOS transistor having a drain connected to the interface pad, said method comprising:

controlling a gate-source potential of the protection transistor so that the protection transistor is in a non-conducting state when the integrated circuit is in a normal operating mode: and applying a first impedance to a gate of the protection transistor which approximates an output impedance of the source of the internal integrated circuit signal so that the protection transistor and the output transistor respectively conduct a current which is proportional to a ratio of effective channel widths of the protection transistor and the output transistor when the simulated ESD is applied to the integrated circuit.

* * * * *